United States Patent
Wang

(10) Patent No.: US 8,902,638 B2
(45) Date of Patent: Dec. 2, 2014

(54) REPLACEMENT OF A FAULTY MEMORY CELL WITH A SPARE CELL FOR A MEMORY CIRCUIT

(71) Applicant: Inphi Corporation, Santa Clara, CA (US)

(72) Inventor: David T. Wang, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 21 days.

(21) Appl. No.: 13/791,807

(22) Filed: Mar. 8, 2013

(65) Prior Publication Data

US 2013/0182489 A1 Jul. 18, 2013

Related U.S. Application Data

(63) Continuation-in-part of application No. 13/620,288, filed on Sep. 14, 2012.

(60) Provisional application No. 61/535,780, filed on Sep. 16, 2011.

(51) Int. Cl.
*G11C 29/04* (2006.01)
*G11C 11/24* (2006.01)
*G11C 11/40* (2006.01)
*G11C 29/00* (2006.01)

(52) U.S. Cl.
CPC ............... *G11C 29/04* (2013.01); *G11C 11/24* (2013.01); *G11C 11/40* (2013.01); *G11C 29/846* (2013.01); *G11C 29/76* (2013.01); *G11C 29/808* (2013.01)
USPC .......................................... 365/149; 365/200

(58) Field of Classification Search
CPC ............................ G11C 29/808; G11C 11/404
USPC .................................................. 365/200, 149
See application file for complete search history.

(56) References Cited

U.S. PATENT DOCUMENTS

| 6,400,621 B2 * | 6/2002 | Hidaka et al. ................. 365/200 |
| 2012/0243299 A1 * | 9/2012 | Shau ............................. 365/149 |
| 2012/0257459 A1 * | 10/2012 | Berke ....................... 365/189.02 |

* cited by examiner

*Primary Examiner* — Hoai V Ho
*Assistant Examiner* — Tri Hoang
(74) *Attorney, Agent, or Firm* — Richard T. Ogawa; Ogawa P.C.

(57) ABSTRACT

A memory integrated circuit device is provided. The device includes a plurality of regular address inputs and at least one spare address input configured for a selected mode or an unselected mode. The device includes a plurality of control inputs, a plurality of data inputs, and a plurality of data outputs. The device has a plurality of memory arrays. Each of the memory arrays comprises a plurality of memory cells. Each of the plurality of memory cells is coupled to a data input/output. The device has a spare group of memory cells comprising a plurality of spare memory cells. Each of the plurality of spare memory cells is externally (or internally) addressable using the address match table and configured with the spare address input; whereupon the spare address input is coupled to the address match table to access the spare memory cells.

15 Claims, 7 Drawing Sheets

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

FIGURE 2

REPLACEMENT OF A FAULTY MEMORY CELL WITH A SPARE CELL FOR A MEMORY CIRCUIT

CROSS-REFERENCES TO RELATED APPLICATIONS

The present application is a continuation-in part application of and incorporates by reference, for all purposes, the following U.S. patent application Ser. No. 13/620,288, filed Sep. 14, 2012, which claims priority to U.S. Provisional Application No. 61/535,780 filed Sep. 16, 2011.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

Although highly successful, low latency memories have limitations.

BRIEF SUMMARY OF THE INVENTION

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an embodiment, the present invention provides a memory interface device. This device can include address input(s), address output(s), an address match table, a control module, and a multiplexer. In a specific embodiment, the memory interface device can be selected from a register device, a buffer device, an advanced memory buffer, a buffer on-board, or the like and combinations thereof.

The address input(s) can be configured to receive address information from an address stream of a host controller, while the address output(s) can be coupled to a plurality of memory devices and be configured to drive address information. In a specific embodiment, the plurality of memory devices can include a plurality of DRAM devices, Flash devices, or other like memory devices. Furthermore, the multiplexer, which can be a MUX or DEMUX, can be coupled to the address input and the address output.

The address match table can include an array of SRAM cells, or the like. In a specific embodiment, this address match table can include a plurality of bad address information and a plurality of spare memory locations. Each of the plurality of bad address information can be associated with one of the plurality of spare memory locations. Each of the plurality of bad address information can include a rank ID, a bank ID, a chip ID, a row address, and a column address. Additional parameters can also be included. Each of the plurality of spare memory locations can include a first column, second column, and an nth column. Various numbers and configurations of spare memory locations can be used depending on design and related applications. The address match table can be configured to receive bad address information and can be configured to transfer the spare memory location to replace the bad address associated with the bad address information.

The control module can be a command and address module, or the like. This control module can be integrated with the address match table. In a specific embodiment, this control module can be configured to determine address information from an address stream from an address command bus coupled to a host controller during a run time operation. This control module can be configured to compare each address from the address steam and configured to determine whether each address matches with a stored address in the address match table to identify a bad address. The control module can also be configured to replace the bad address with the revised address of the spare memory location.

In a specific embodiment, the control module can include an input receiver module or a control and status register module. The control module can also include an input command, an input address, and an input chip-select decoder module. Other components, such as a parity checking module, a signal inversion module, a signal delay module, a PLL (Phase-locked loop), a command and address control module, an input buffer termination module, a clock stop power down module, a reset module, and the like, can also be included with the memory interface device.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

In an embodiment, the present invention can provide a memory integrated circuit device. This device can include a plurality of regular address inputs, at least one spare address configured for a selected mode or an unselected mode, a plurality of control inputs, a plurality of data inputs, a plurality of data outputs, a plurality of memory arrays, and a spare group of memory cells.

In a specific embodiment, each of the plurality of memory arrays can include a plurality of memory cells. Each of these memory cells can be coupled to a data input/output. Also, the spare group of memory cells can include a plurality of spare memory cells. The spare group of memory cells can include a spare column, a spare row, a spare bank, or the like. Each of these memory cells can be externally addressable using an address match table and can be configured with the spare address input. The spare address input can be coupled to the address match table to access the spare memory cells. In a specific embodiment, the spare address input can include one of three unused column address inputs A11, A13, and A17.

In a specific embodiment, the plurality of spare memory cells can be accessed from the group of memory cells using the spare address input during the selected mode. During a read operation, data from the accessed spare memory cell can be transferred to one of the plurality of data outputs. During a write operation, data from one of the plurality of data inputs can be transferred into the accessed spare memory cell. During the unselected mode, the address input can remain inactive while the plurality of regular address inputs remains active.

Also, the spare group of memory cells can include various configurations of spare columns and spare address inputs. For example, the spare group can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device can also include an encoded command and address bus having a shared command signal and an address signal, an internal data input reference voltage circuit, a command and address parity checking circuit, a set of circuits designed to support connectivity testing, a reset input signal, a set of multi-purpose status registers configured to be read out, or the like and combinations thereof.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

Example: Utilizing an Address Match Table in Memory Interface Circuit, Controlling Spare Memory Storage Cells to Dynamically Replace Faulty Storage Cells in Memory Devices, as illustrated by FIG. 1.

Figure 1:
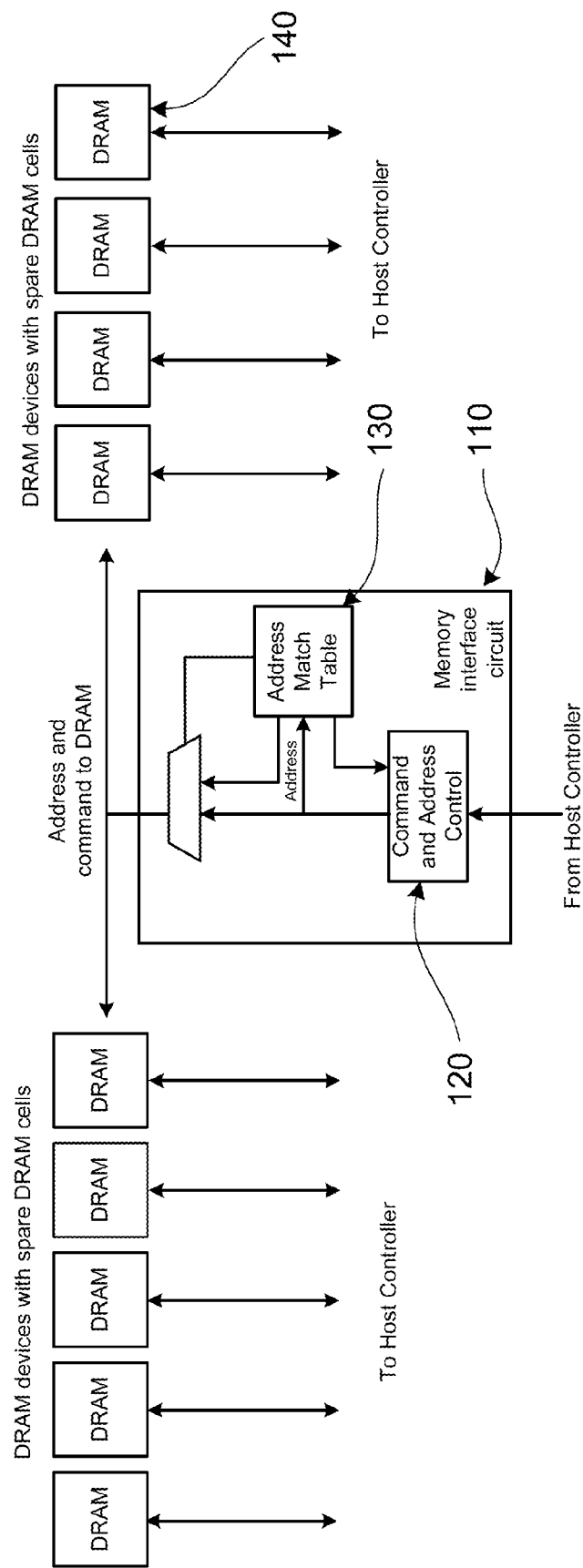
FIG. 1 illustrates a simplified block diagram of an interface circuit according to an embodiment of the present invention.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations.

Figure 3:
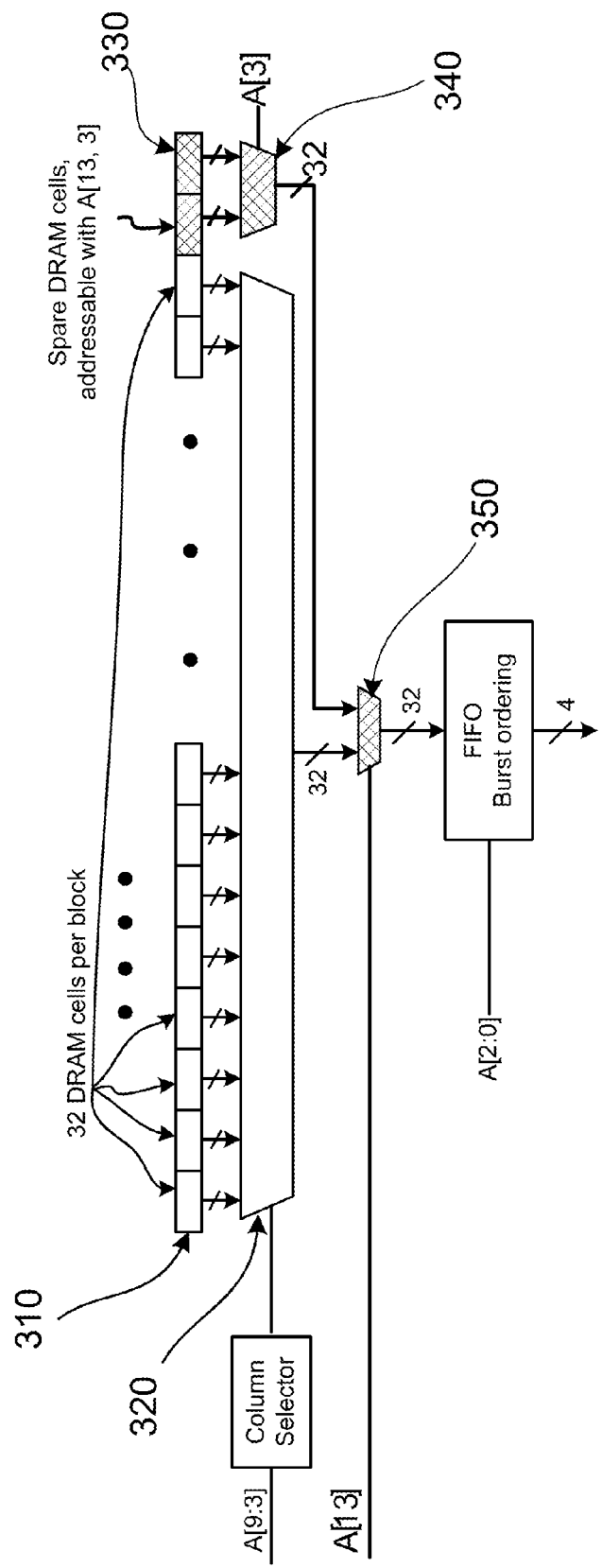
FIG. 3 illustrates a simplified diagram of spare memory cells in a DRAM device according to an embodiment of the present invention.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

The AMT can be a data structure that is part of the address path of a Registering Clock Driver (RCD), or register, of a DRAM device. The AMT contains the list of bad or weak memory cells, which can be a Weak Cell List (WCL) or list of known Weak Bit Addresses (WBA). These lists can be loaded into the AMT from a non-volatile storage during a system boot up. During normal operation, the AMT checks the addresses of commands that flow through the RCD for accesses to known bad or weak memory cells. In the case of a match, the AMT is able to initiate a cell repair or replacement process, which can include data replacement from Externally-Addressable-Spare-Columns (ESC) in the DRAM device. DRAM devices that can use such techniques include DDR4 RDIMM, LRDIMM with DDR4 SDRAM, or other like devices.

The AMT can include multiple parallel AMTs to perform parallel operations of address matching and self-scrubbing or error detection and correction. For example, one AMT can perform a self-scrub operation, while another AMT continues to operate and respond to DRAM commands. Weak cell repair processes and cell optimization processes can also be conducted in parallel during normal operation. The number of AMTs in a given implementation can vary and can be determined be the maximum number of logical ranks that may be supported in a given memory system.

As an example, the each AMT can include a Row Address Match Table (RAMT) structure and a Column Address Match Table (CAMT) structure, which can be a Fast Column Address Match Table (FCAMT). The RAMT can contain a plurality of row addresses that are associated with specific rank, bank, and column addresses. When a row access command is received, the row address may be sent to every RAMT. In the case of a row address match, the column address associated with the row address can be moved to populate the associated CAMT. The row address tables can be configured to support 1, 2, 4, and 8, or more, ranks of DRAM devices with support from addresses buses for independent and parallel lookups.

FIG. 3 shows an implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that normally, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.
AMT: Address Match Table
CID: Chip ID
IFR: In-Field Repair
LRDIMM: Load-Reduced Dual Inline Memory Module
MB: Memory Buffer MemBIST: Software tool to generate built in self test blocks for a memory matrix as a VHDL model for the whole memory system.

RCD: Registering Clock Driver, Also known more simply as the "Register"

RDIMM: Registered Dual Inline Memory Module

RID: Rank ID

SPD: Serial Presence Detect

VRT: Variable Retention Time

WBA: Weak Bit Address

WBAL: Weak Bit Address List

WCM: Weak Cell Management

In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known weak DRAM storage cells.

Figure 4:
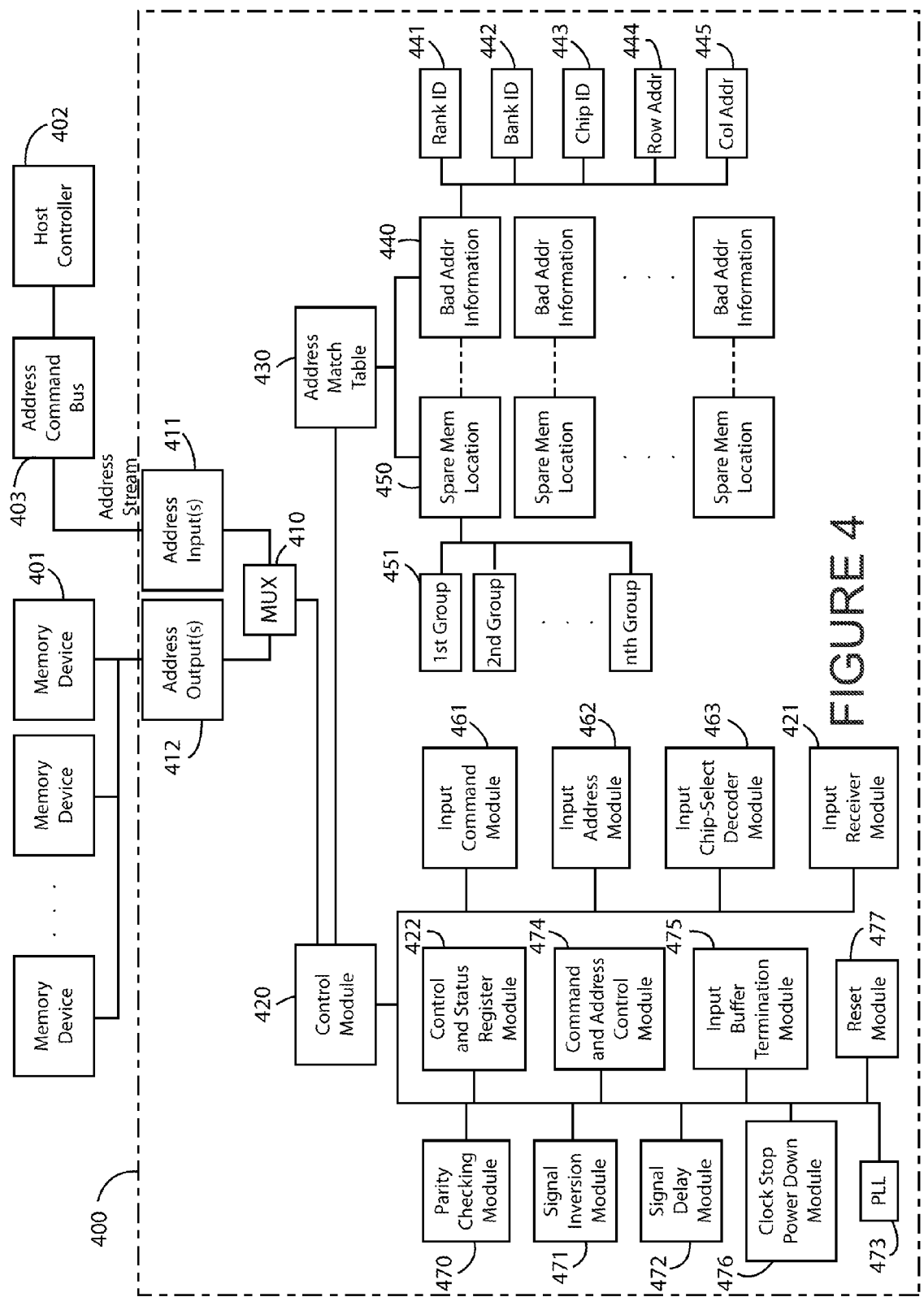
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof.

The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
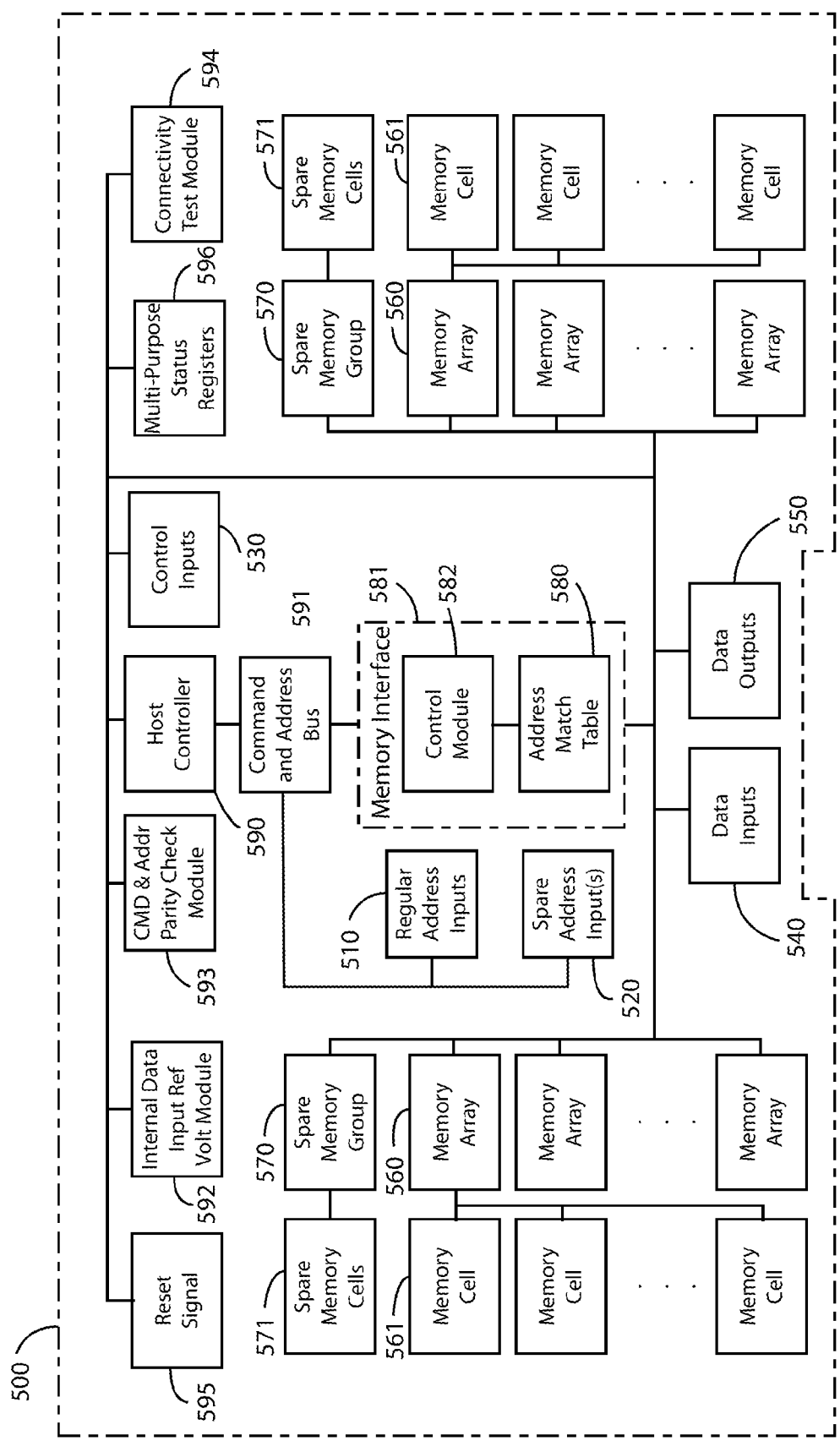
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.
 1. Receive, at an address input(s) of a memory interface device, address information from an address stream of a host computer;
 2. Drive address information from an address output(s) of the memory interface device to a plurality of memory devices;
 3. Process the address stream from an address command bus coupled to the host controller during a run time operation;
 4. Compare successively each address from the address stream from information in an address match table to determine to whether an address matches with a stored address in an address match table;
 5. Identify a bad address provided in the address match table; and
 6. Replace the bad address with a revised address of a spare memory location;
 7. Transfer the revised address to a multiplexer coupled to the address output; and
 8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
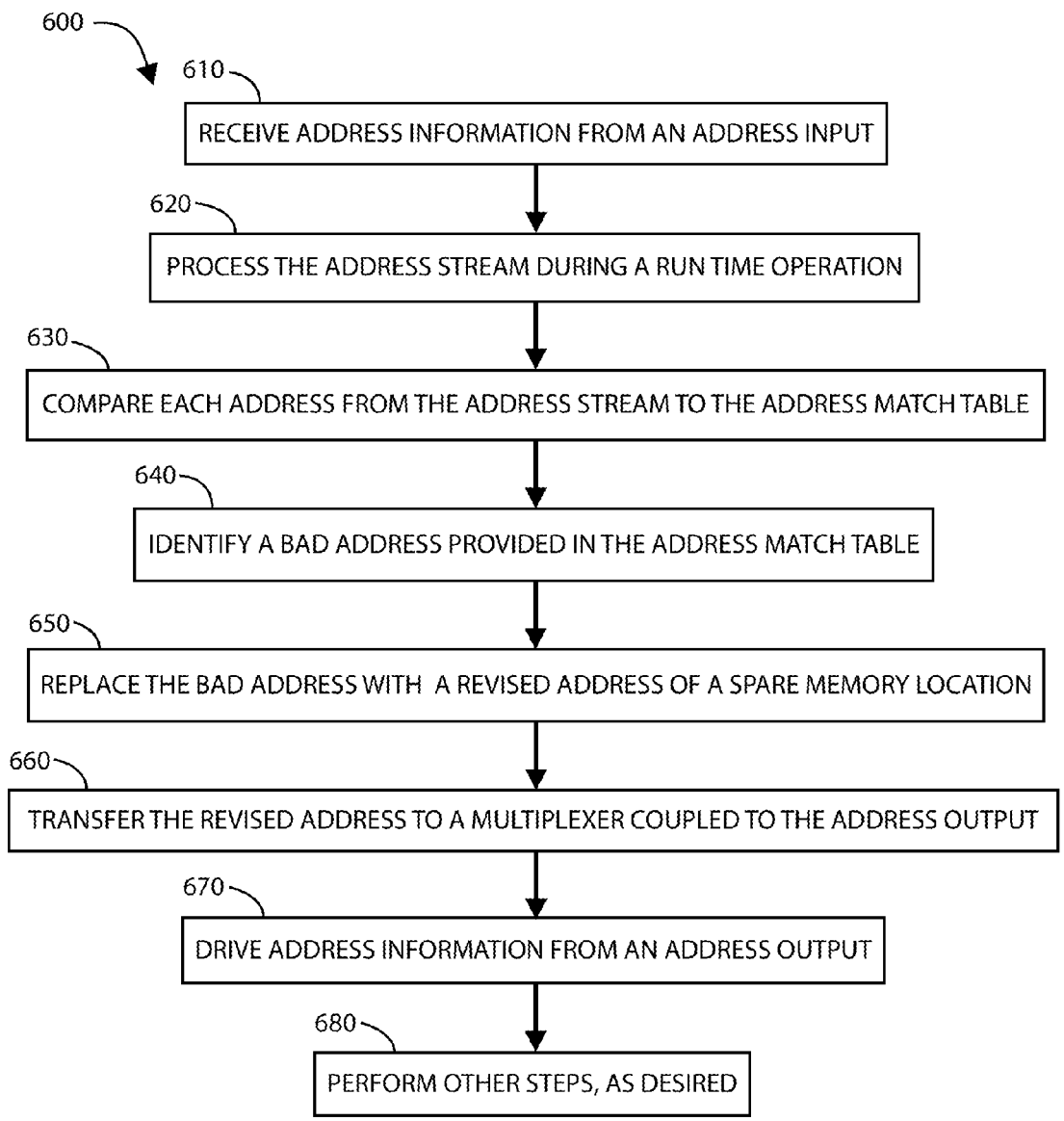
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer. The memory interface device can be selected from a register device, a buffer device, an advanced memory buffer, or a buffer on-board. The method 600 can also include driving address information from an address output or outputs of the memory interface device to a plurality of memory devices, step 620. These memory devices can include a plurality of DRAM devices, Flash devices, or other like devices and combinations thereof.

During a run time operation, the address stream from an address command bus coupled to the host controller can be processed, step 630. Each address from the address stream can be compared successively to determine whether an address matches with a stored address in an address match table, step 640. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 650, and can be replaced with a revised address of a spare memory location, step 660. The revised address can be transferred to a multiplexer coupled to the address output, step 670. The address match table can be configured to receive bad address information and transfer the spare memory location to replace the bad address associated with the bad address information.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

Figure 7:
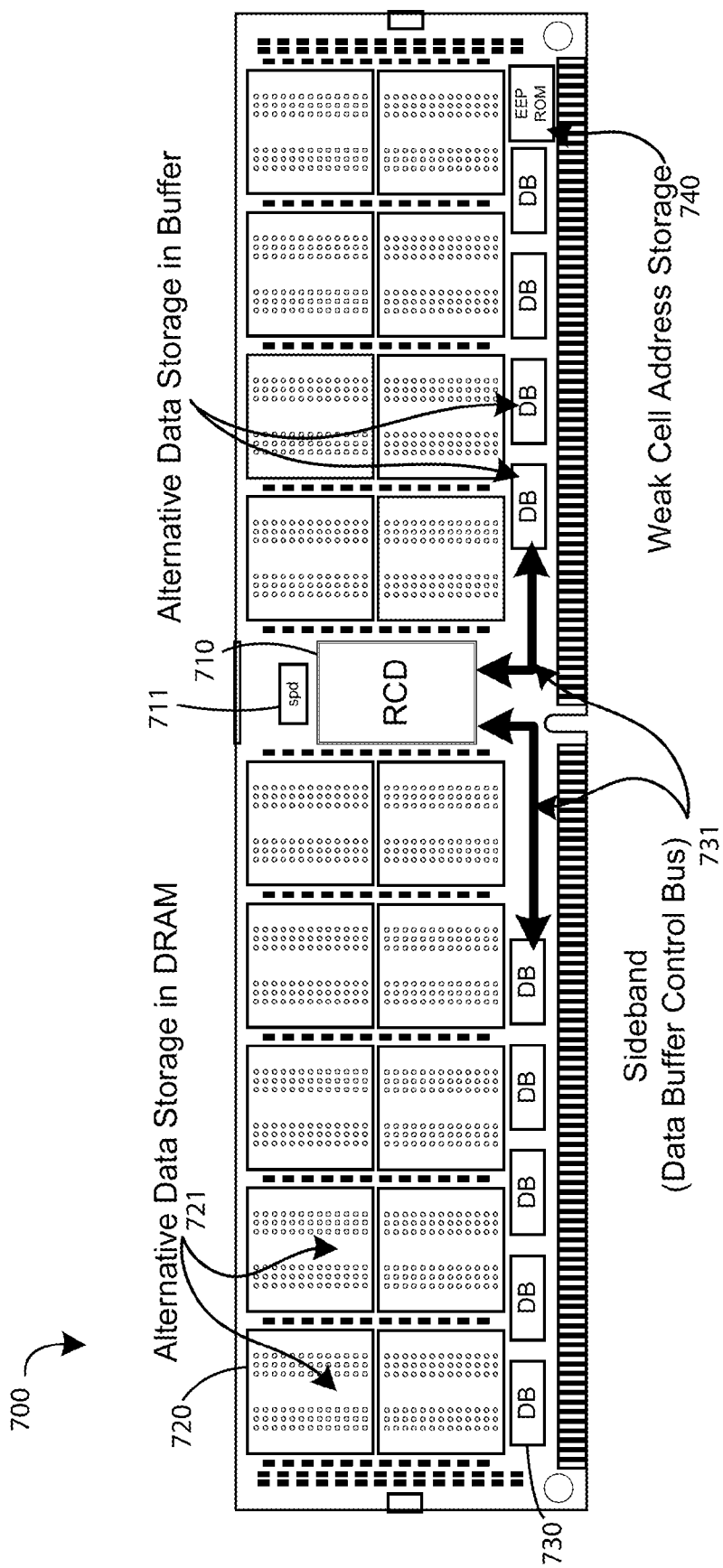
FIG. 7 illustrates a simplified diagram of a memory integrated circuit device according to an embodiment of the present invention.

FIG. 7 illustrates a simplified diagram of a memory integrated circuit device according to an embodiment of the present invention. As shown, device 700 can include a Registering Clock Driver (RCD) module 710. The RCD 710 is coupled to a plurality of memory arrays 720 and a plurality of data buffers 730. The data buffers 730 are coupled to the RCD 710 via the control buses 731. The device 700 includes a serial presence detect (SPD) module 711, which can contain SPD data to provide a standardized method to access information about the memory module.

The RCD 710 can include or be coupled to a host controller and an address match table module. As described previously, the memory interface device modules can be provided within the address path of the RCD 710. Memory module 740, which can be a non-volatile memory such as an EEPROM (Electrically Erasable Programmable Read-Only Memory), stores the WCL to be loaded into the AMT. With the WCL, bad or weak memory cells can be replaced with spare memory cells 721 within the memory arrays 720.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that teims, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

The invention claimed is:

1. A memory integrated circuit device, the device comprising:
   a plurality of regular address inputs;
   at least one spare address configured for a selected mode or an unselected mode;
   a plurality of control inputs;
   a plurality of data inputs;
   a plurality of data outputs;
   a plurality of memory arrays, each of the plurality of memory arrays comprising a plurality of memory cells, each of the plurality of memory cells being coupled to a data input/output;
   a parity checking module; and
   a spare group of memory cells comprising a plurality of spare memory cells, each of the plurality of spare memory cells being externally addressable using a first address match table and configured with the spare address input, whereupon the spare address input is coupled to the first address match table to access the spare memory cells based upon error detection by the parity checking module and using a second address match table parallel to the first address match table.

2. The device of claim 1 wherein the spare group of memory cells is selected from a spare column, a spare row, or a spare bank.

3. The device of claim 1 wherein the at least one spare address input comprises one of three unused column address inputs A11, A13, and A17.

4. The device of claim 1 wherein during the selected mode at least one of the plurality of spare memory cells being accessed from the group of memory cells using the spare address input; whereupon during a read operation, data from the accessed spare memory cell is transferred to one of the plurality of data outputs; or whereupon during a write operation, data from one of the plurality of data inputs is transferred into the accessed spare memory cell.

5. The device of claim 1 wherein during the unselected mode the spare address input is inactive; and wherein the plurality of regular address inputs is active.

6. The device of claim 1 wherein the spare group of memory cells comprises a first spare column, a second spare column, a third spare column, a fourth spare column, a fifth spare column, a sixth spare column, and a seventh spare column; wherein the at least one spare address input comprises a first spare address input, a second spare address input, and a third spare address input.

7. The device of claim 1 wherein the spare group of memory cells comprises a first spare column, a second spare column, and a third spare column; wherein the at least one spare address input comprises a first spare address input and a second spare address input.

8. The device of claim 1 further comprising
an encoded command and address bus having a shared command signal and an address signal,
an internal data input reference voltage circuit,
a command and address parity checking circuit,
a set of circuits designed to support connectivity testing,
a reset input signal, or
a set of multi-purpose status registers configured to be read out.

9. A DRAM integrated circuit device, the device comprising:
a plurality of regular address inputs;
at least one spare address configured for a selected mode or an unselected mode;
a plurality of control inputs;
a plurality of data inputs;
a plurality of data outputs;
a plurality of memory arrays, each of the plurality of memory arrays comprising a plurality of memory cells, each of the memory cells comprising a storage capacitor coupled to an access transistor, each of the plurality of memory cells being coupled to a data input/output;
a parity checking module; and
a spare column of memory cells comprising a plurality of spare memory cells, each of the plurality of spare column of memory cells being externally addressable using a first address match table and configured with the spare address input, whereupon the spare address input is coupled to the first address match table to access the spare column of memory cells based upon error detection by the parity checking module and using a second address match table parallel to the first address match table.

10. The device of claim 9 wherein the at least one spare address input comprises one of three unused column address inputs A11, A13, and A17.

11. The device of claim 9 wherein during the selected mode at least one of the plurality of spare column of memory cells being accessed from the group of memory cells using the spare address input; whereupon during a read operation, data from the accessed spare memory cell is transferred to one of the plurality of data outputs; or whereupon during a write operation, data from one of the plurality of data inputs is transferred into the accessed spare memory cell.

12. The device of claim 9 wherein during the unselected mode the spare address input is inactive; and wherein the plurality of regular address inputs is active.

13. The device of claim 9 wherein the spare column of memory cells comprises a first spare column, a second spare column, a third spare column, a fourth spare column, a fifth spare column, a sixth spare column, and a seventh spare column; wherein the at least one spare address input comprises a first spare address input, a second spare address input, and a third spare address input.

14. The device of claim 9 wherein the spare column of memory cells comprises a first spare column, a second spare column, and a third spare column; wherein the at least one spare address input comprises a first spare address input and a second spare address input.

15. The device of claim 9 further comprising
an encoded command and address bus having a shared command signal and an address signal,
an internal data input reference voltage circuit,
a command and address parity checking circuit,
a set of circuits designed to support connectivity testing,
a reset input signal, or
a set of multi-purpose status registers configured to be read out.

* * * * *